(12) United States Patent
Chen

(10) Patent No.: US 11,488,876 B2
(45) Date of Patent: Nov. 1, 2022

(54) ELECTRONIC COMPONENT MEASURING EQUIPMENT, ELECTRONIC COMPONENT MEASURING METHOD, AND LED MANUFACTURING METHOD

(71) Applicant: ASTI GLOBAL INC., TAIWAN, Taichung (TW)

(72) Inventor: Ying-Chieh Chen, Taichung (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 0 days.

(21) Appl. No.: 17/494,864

(22) Filed: Oct. 6, 2021

(65) Prior Publication Data

US 2022/0108928 A1    Apr. 7, 2022

(30) Foreign Application Priority Data

Oct. 7, 2020  (TW) ................................. 109134667
Dec. 18, 2020 (TW) ................................. 109145015
Sep. 24, 2021 (TW) ................................. 110135673

(51) Int. Cl.
  *H01L 21/66*   (2006.01)
  *H01L 33/00*   (2010.01)

(52) U.S. Cl.
  CPC .............. *H01L 22/14* (2013.01); *H01L 22/12* (2013.01); *H01L 22/32* (2013.01); *H01L 33/005* (2013.01)

(58) Field of Classification Search
  CPC ......... H01L 22/14; H01L 22/12; H01L 22/32; H01L 33/005; H01L 33/0095; G01R 31/2635
  USPC ................................ 324/762.07, 762.01, 53
  See application file for complete search history.

(56) References Cited

U.S. PATENT DOCUMENTS

2004/0232926 A1* 11/2004 Kashima ............ G01R 1/06788
                                                  324/755.01
2010/0259478 A1* 10/2010 Batyrev .................. G06F 3/041
                                                  345/158
2017/0043086 A1*  2/2017 Popa-Simil ........... A61M 25/04

* cited by examiner

*Primary Examiner* — Giovanni Astacio-Oquendo

(57) ABSTRACT

An electronic component measuring equipment includes a first mounting platform, a second mounting platform, an actuating device, a current output module, a switching device and an optical measuring component. Multiple probe pairs are disposed on a probe substrate mounted on the first mounting platform. Multiple under-test electronic components are disposed on a testing substrate mounted on the second mounting platform. The actuating device is configured to make at least partial of the probe pairs on the probe substrate in contact with at least partial of under-test electronic components. The current output module provides a constant current to the probe substrate, and conducting loops are formed between the probe pairs and the under-test electronic components in contact therewith. The switching device switches the constant current to each probe pairs. The optical measuring component measures light signals generated by the under-test electronic components.

21 Claims, 14 Drawing Sheets

ELECTRONIC COMPONENT MEASURING EQUIPMENT, ELECTRONIC COMPONENT MEASURING METHOD, AND LED MANUFACTURING METHOD

CROSS-REFERENCE TO RELATED APPLICATION

This non-provisional application claims priority under 35 U.S.C. § 119(a) on Patent Application No(s). 109134667 filed in Taiwan, R.O.C. on Oct. 7, 2020, Patent Application No(s). 109145015 filed in Taiwan, R.O.C. on Dec. 18, 2020, and Patent Application No(s). 110135673 filed in Taiwan, R.O.C. on Sep. 24, 2021, the entire contents of which are hereby incorporated by reference.

BACKGROUND OF THE INVENTION

1. Field of the Invention

The present disclosure relates to an electronic component measuring equipment, an electronic component measuring method and an LED manufacturing method.

2. Description of the Related Art

According to prior art, a plurality of electronic components to be tested and disposed on a wafer substrate must be separated in order to undergo optical testing, albeit in a time-consuming, process-intensive way.

BRIEF SUMMARY OF THE INVENTION

An objective of the present disclosure is to provide an electronic component measuring equipment, an electronic component measuring method and an LED manufacturing method.

To achieve at least the above objective, the present disclosure provides an electronic component measuring equipment, including a first mounting platform, a second mounting platform, an actuating device, a current output module, a switching device and an optical measuring component. The first mounting platform is for use in mounting a probe substrate. Multiple probe pairs are disposed on the probe substrate. The second mounting platform is for use in mounting a testing substrate. Multiple under-test electronic components are disposed on the testing substrate. The actuating device makes the first mounting platform and the second mounting platform approach each other, such that at least partial of the probe pairs on the probe substrate mounted on the first mounting platform are in contact with at least partial of the under-test electronic components on the testing substrate mounted on the corresponding second mounting platform, respectively. The current output module provides a constant current to the probe substrate mounted on the first mounting platform. Conducting loops are formed between the at least partial of probe pairs and the at least partial of under-test electronic components in contact with the probe pairs, such that the under-test electronic components generate light signals through the conducting loops. The switching device switches the constant current to each of the probe pairs. The optical measuring component measures the light signals generated by the under-test electronic components on the testing substrate mounted on the second mounting platform.

To achieve at least the above objective, the present disclosure further provides an electronic component measuring equipment, including a first mounting platform, a second mounting platform, an actuating device, a current output module, a switching device, a voltage measuring component and a computation device. The first mounting platform is for use in mounting a probe substrate. Multiple probe pairs are disposed on the probe substrate. The second mounting platform is for use in mounting a testing substrate. Multiple under-test electronic components are disposed on the testing substrate. The actuating device makes the first mounting platform and the second mounting platform approach each other, such that at least partial of the probe pairs on the probe substrate mounted on the first mounting platform are in contact with at least partial of the under-test electronic components on the testing substrate mounted on the corresponding second mounting platform, respectively. The current output module provides a constant current to the probe substrate mounted on the first mounting platform. Conducting loops are formed between the at least partial of probe pairs and the at least partial of under-test electronic components in contact with the probe pairs. The switching device switches the constant current provided by the current output module to each of the probe pairs. The voltage measuring component measures voltages of the under-test electronic components on the testing substrate mounted on the second mounting platform. The computation device is electrically connected to the voltage measuring component to receive the voltages measured by the voltage measuring component.

To achieve at least the above objective, the present disclosure further provides an electronic component measuring method including the steps of: providing a testing substrate, wherein the testing substrate has multiple under-test electronic components disposed thereon; disposing wires to form multiple under-test loops based on the under-test electronic components; providing a constant current to at least one of the under-test loops to form at least one conducting loop; and measuring a light signal generated by the at least one of the under-test electronic components.

To achieve at least the above objective, the present disclosure further provides an electronic component measuring method including the steps of: providing a testing substrate, wherein the testing substrate has thereon multiple resistive components with known resistance values; disposing wires to form multiple first under-test loops based on the resistive components; providing a constant current to one of the first under-test loops to form a first conducting loop and measuring a cross voltage of the first conducting loop at the constant current to obtain a first driving voltage; replacing the resistive components with multiple electronic components; forming multiple second under-test loops based on the electronic components and the wires; providing the constant current to one of the second under-test loops to form a second conducting loop and measuring a voltage at the constant current to obtain a second driving voltage; and calculating a voltage difference between the first driving voltage and the second driving voltage.

To achieve at least the above objective, the present disclosure further provides an LED manufacturing method including the electronic component measuring method.

DETAILED DESCRIPTION OF THE INVENTION

To facilitate understanding of the object, characteristics and effects of this present disclosure, embodiments together with the attached drawings for the detailed description of the present disclosure are provided.

Referring to FIG. 1 through FIG. 15, an embodiment of the present disclosure provides an electronic component measuring equipment Z1 including a second mounting platform M1, a first mounting platform M2 and an optical measuring component M3. The second mounting platform M1 is for use in mounting a testing substrate S. Multiple under-test electronic components C are disposed on the testing substrate S. The first mounting platform M2 is disposed above the second mounting platform M1. The first mounting platform M2 includes a probe substrate 1 and multiple probe pairs 2 disposed on the probe substrate 1. The optical measuring component M3 is disposed below the second mounting platform M1 and adapted to perform optical testing on the multiple under-test electronic components C. Thus, the under-test electronic components C generate light L with electric power supplied by the corresponding probe pairs 2. The optical measuring component M3 performs optical testing with the light L generated by the under-test electronic components C.

Embodiment

Figure 1:
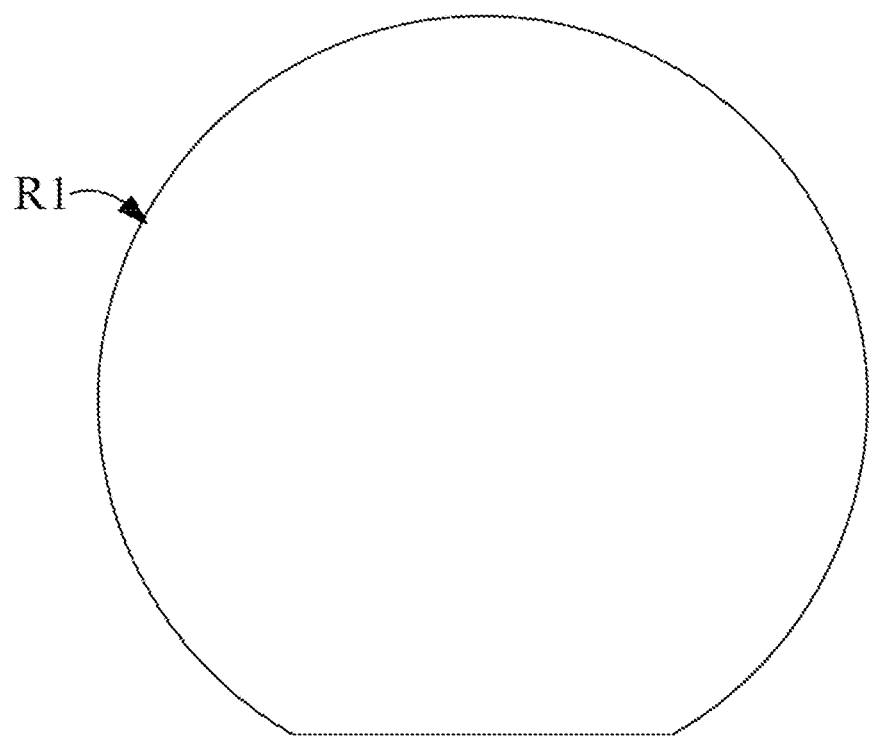
FIG. 1 is a top view of forming a first material layer on a wafer material with a probe substrate manufacturing method according to an embodiment of the present disclosure.
Figure 2:
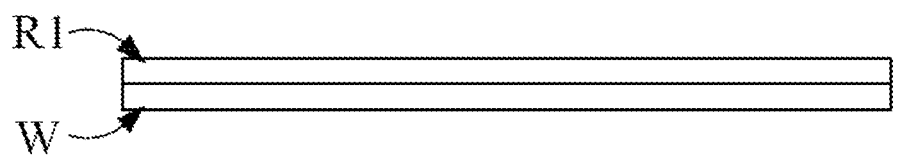
FIG. 2 is a lateral view of forming a first material layer on a wafer material with the probe substrate manufacturing method according to an embodiment of the present disclosure.
Figure 3:
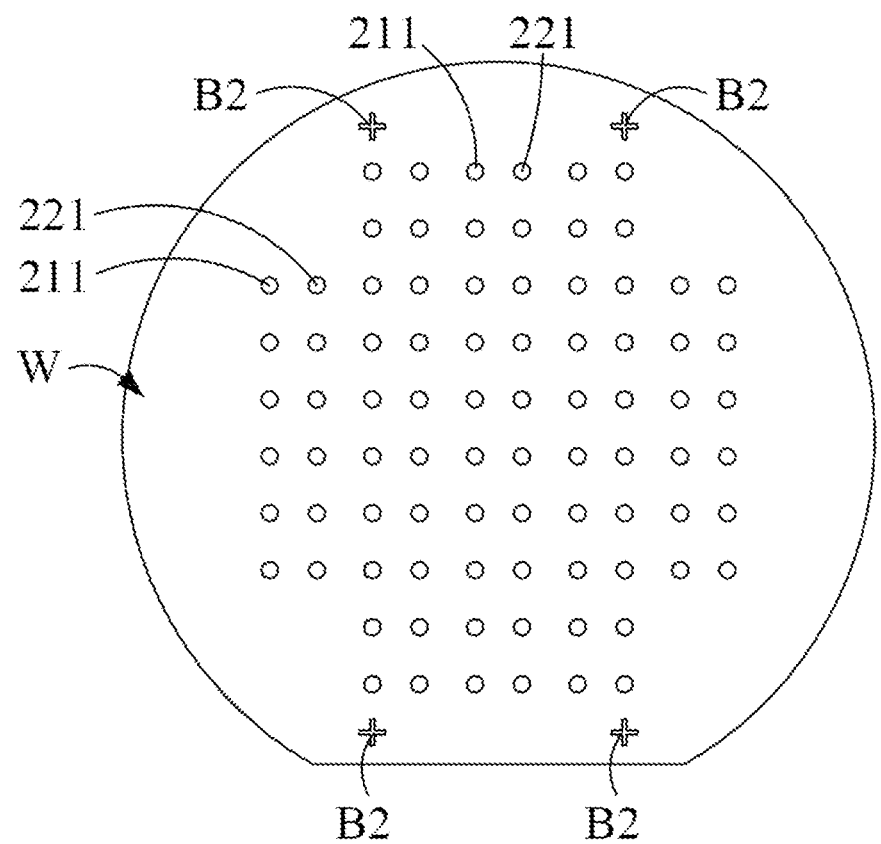
FIG. 3 is a top view of removing part of the first material layer to form multiple first cylinders, multiple second cylinders and multiple second alignment marks on the wafer material with the probe substrate manufacturing method according to an embodiment of the present disclosure.
Figure 4:
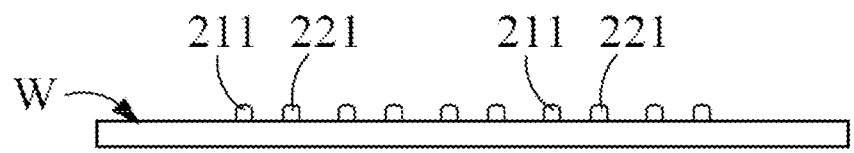
FIG. 4 is a lateral view of removing part of the first material layer to form multiple first cylinders, multiple second cylinders and multiple second alignment marks on the wafer material with the probe substrate manufacturing method according to an embodiment of the present disclosure.
Figure 5:
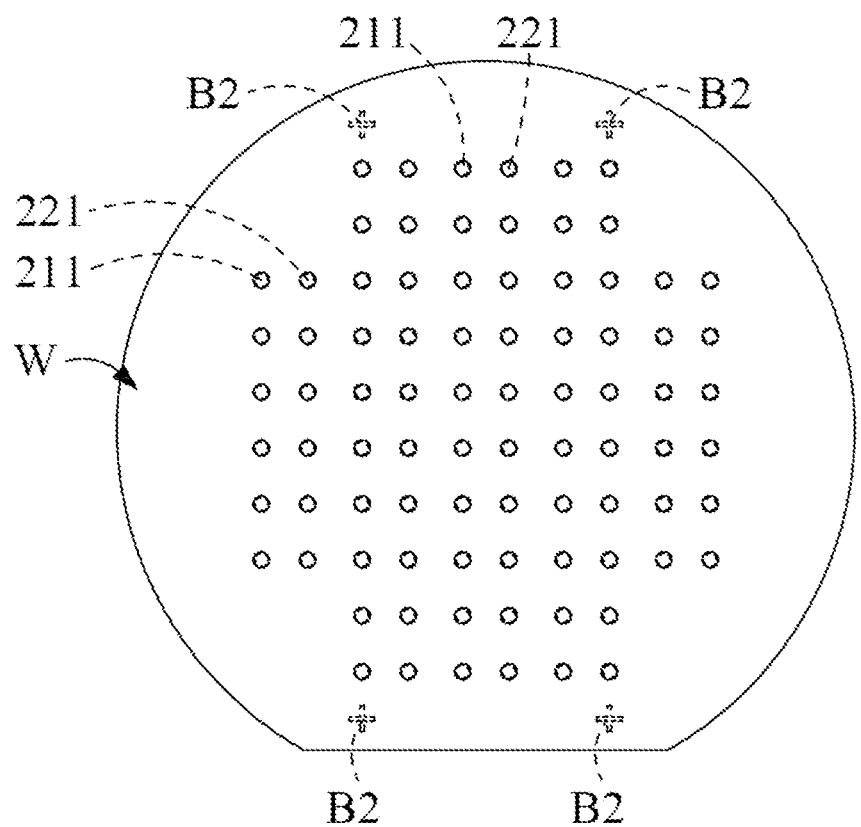
FIG. 5 is a top view of forming a second material layer on the wafer material to cover the multiple first cylinders, multiple second cylinders and multiple second alignment marks with the probe substrate manufacturing method according to an embodiment of the present disclosure.
Figure 6:
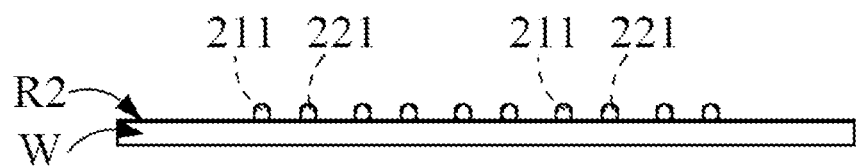
FIG. 6 is a lateral view of forming a second material layer on the wafer material to cover the multiple first cylinders, multiple second cylinders and multiple second alignment marks with the probe substrate manufacturing method according to an embodiment of the present disclosure.

Referring to FIG. 1 through FIG. 10, an embodiment of the present disclosure provides a method of manufacturing the probe substrate 1. For instance, the method of manufacturing the probe substrate 1 includes the steps described below. First, as shown in FIG. 1 and FIG. 2, a first material layer R1 is formed on a wafer material W in a semiconductor process (for example, coating, evaporation deposition, and sputtering) or non-semiconductor process. The first material layer R1 is made of polymeric material (or inorganic material, such as SiOx or SiNx, any resilient material, non-resilient material, any conducting material, or non-conducting material), such as epoxy or photoresist. The wafer material W is semiconductor material, such as sapphire, quartz, glass, and silicon. Then, as shown in FIG. 1 through FIG. 4, part of first material layer R1 is removed in a semiconductor process (for example, exposure, development) or non-semiconductor process to form multiple first cylinders 211, multiple second cylinders 221 and multiple second alignment marks B2 on the wafer material W. Then, as shown in FIG. 5 and FIG. 6, in a semiconductor process (for example, coating, evaporation deposition, sputtering) or non-semiconductor process, a second material layer R2 is formed on the wafer material W to cover multiple first cylinders 211, multiple second cylinders 221 and multiple second alignment marks B2. Next, as shown in FIG. 5 through FIG. 8, in a semiconductor process (for example, exposure, development) or non-semiconductor process, second material layer R2 is patterned to form a probe substrate 1. However, the aforesaid embodiments are illustrative rather than restrictive of the present disclosure.

Figure 16:
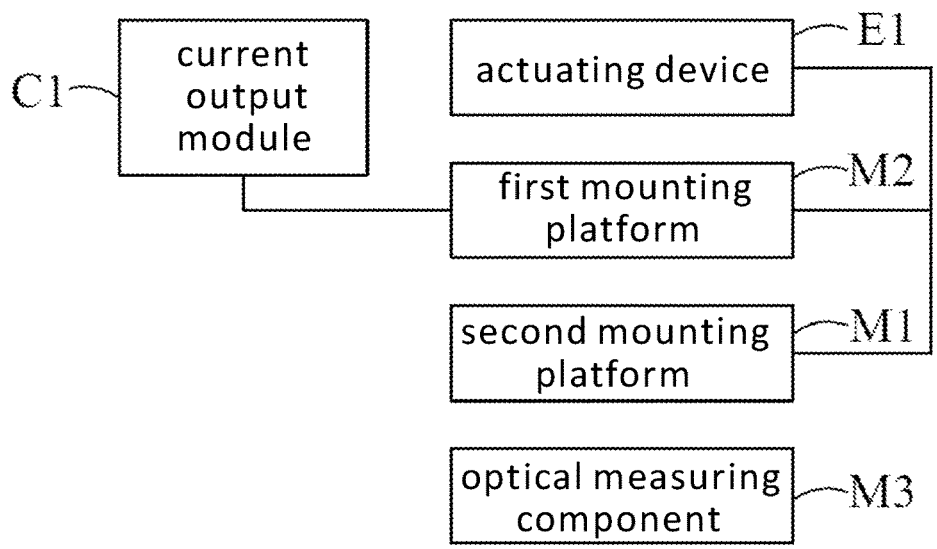
FIG. 16 is a block diagram of the electronic component measuring equipment according to an embodiment of the present disclosure.

Referring to FIG. 16, the present disclosure provides an electronic component measuring equipment Z1 including a first mounting platform M2, a second mounting platform M1, an optical measuring component M3, an actuating device E1 and a current output module C1. The actuating device E1 is electrically connected to the first mounting platform M2 and the second mounting platform M1 and adapted to control the position of connection of the first mounting platform M2 and the second mounting platform M1, such that the first mounting platform M2 and the second mounting platform M1 approach each other for contact and alignment. The current output module C1 provides a current to the first mounting platform M2. In an embodiment, current output module C1 outputs a constant current. In an embodiment, the constant current ranges from 20 µA to 20 mA.

Figure 11:
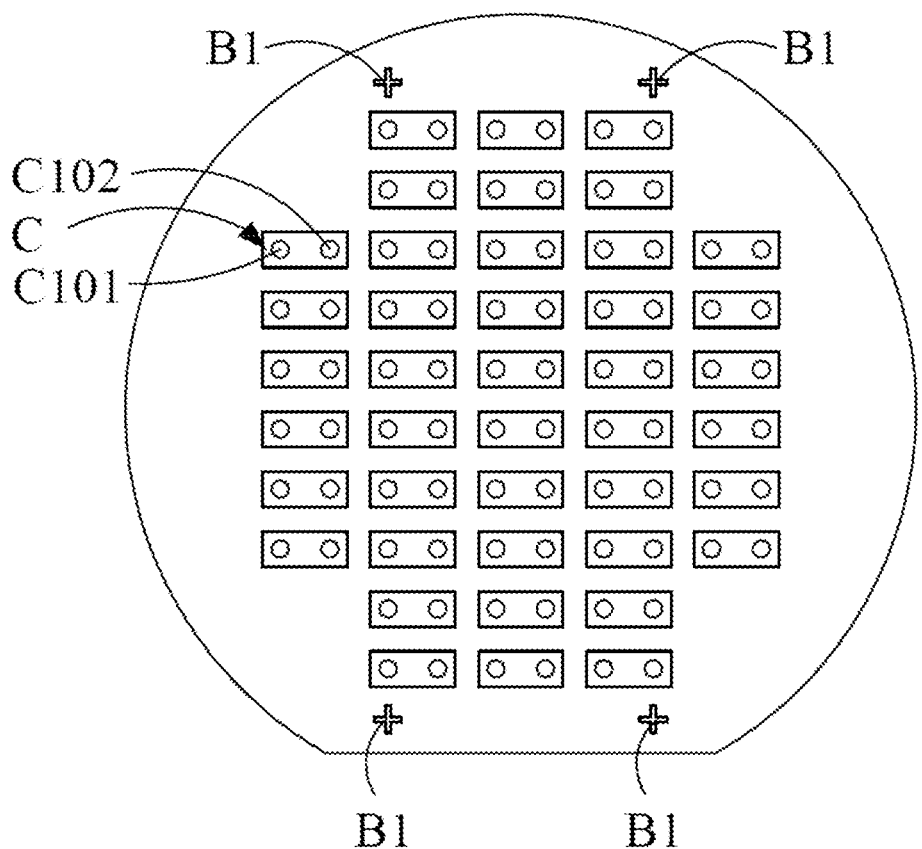
FIG. 11 is a top view of a testing substrate according to an embodiment of the present disclosure.
Figure 12:
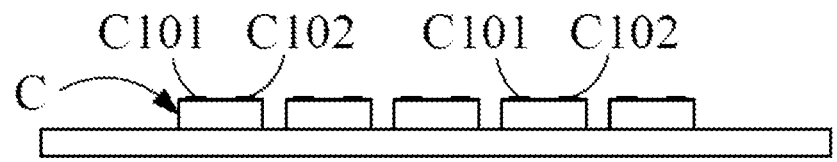
FIG. 12 is a lateral view of the testing substrate according to an embodiment of the present disclosure.
Figure 13:
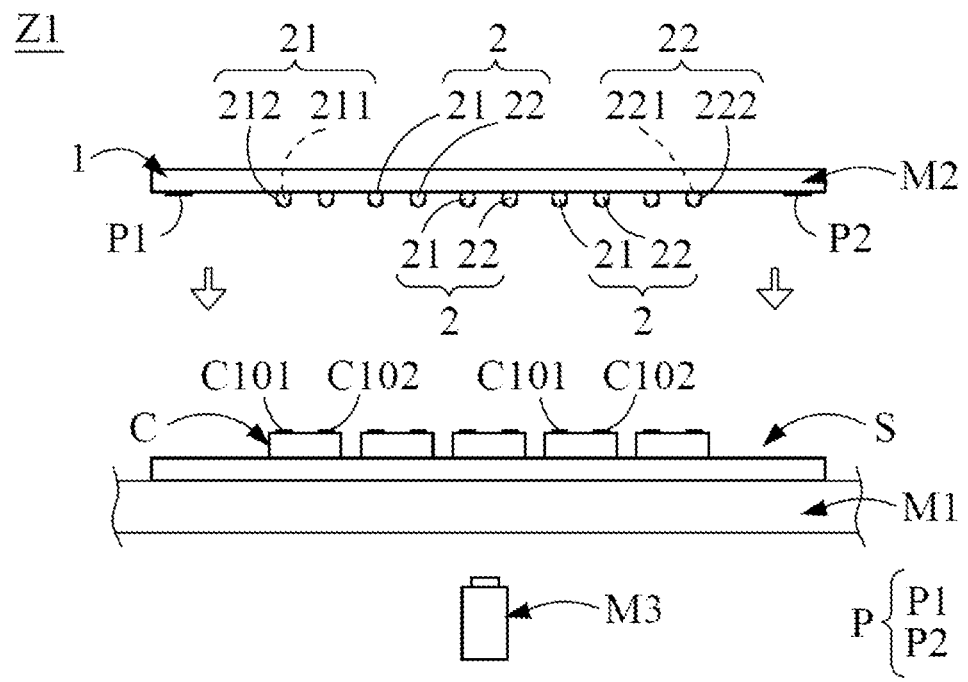
FIG. 13 is a lateral view of the probe substrate of an electronic component measuring equipment according to an embodiment of the present disclosure before electrically contacting with the testing substrate.

First, as shown in FIG. 11 through FIG. 13, the second mounting platform M1 is for use in mounting a testing substrate S. Multiple under-test electronic components C are disposed on the testing substrate S. The multiple under-test electronic components C have not yet been separated from the testing substrate S and have not yet been packaged by any packaging material. The multiple under-test electronic components C are, for example, bare dies. For instance, the second mounting platform M1 and the testing substrate S each have a light-penetrable region, and the under-test electronic components C are bare dies which have not yet been packaged. Furthermore, when the under-test electronic components C are each a horizontal chip, each under-test electronic component C includes a first conducting contact C101 and a second conducting contact C102. However, the present disclosure is not limited thereto.

As shown in FIG. 7 through FIG. 10, FIG. 13 and FIG. 14, the first mounting platform M2 is movably disposed above the second mounting platform M1, whereas the first mounting platform M2 includes a probe substrate 1 and multiple probe pairs 2 disposed on the probe substrate 1. In an embodiment, the size of the probe substrate 1 is the same as or different from the size of the testing substrate S, whereas each probe pair 2 includes a first conducting contact pin 21 and a second conducting contact pin 22. However, the present disclosure is not limited thereto.

Figure 14:
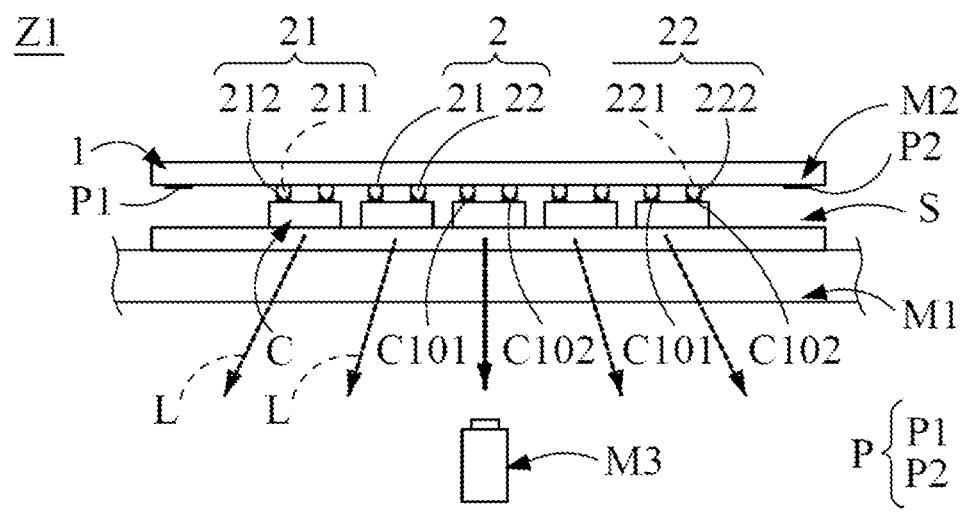
FIG. 14 is a lateral view of the probe substrate of the electronic component measuring equipment according to an embodiment of the present disclosure after electrically contacting with the testing substrate.

Furthermore, as shown in FIG. 13 and FIG. 14, the optical measuring component M3 is disposed below the second mounting platform M1 and adapted to perform optical testing on at least one of the multiple under-test electronic components C. For instance, the optical measuring component M3 is any image capturing device capable of image sensing, but the present disclosure is not limited thereto. Thus, As shown in FIG. 14, the first mounting platform M2 and the second mounting platform M1 approach each other and come into contact with each other because of the actuating device E1 of FIG. 16, whereas the first conducting contact pin 21 and the second conducting contact pin 22 of each probe pair 2 are in electrical contact with the first conducting contact C101 and the second conducting contact C102 of the corresponding under-test electronic component C, respectively; thus, the under-test electronic components C form an under-test loop together with the corresponding probe pair 2 to generate light L with electric power passing the corresponding probe pair 2, and optical testing is performed by the optical measuring component M3 with the light L generated by the under-test electronic components C, so as to distinguish satisfactory under-test electronic components from unsatisfactory under-test electronic components. For instance, the optical testing includes luminescence testing (for determining whether the under-test electronic components C have generated light L), brightness testing (for determining the brightness of the light L generated by under-test electronic components C), wavelength testing, and chromaticity coordinates testing (for evaluating the distribution of the light L generated by the under-test electronic components C in a chromaticity coordinates map).

Figure 7:
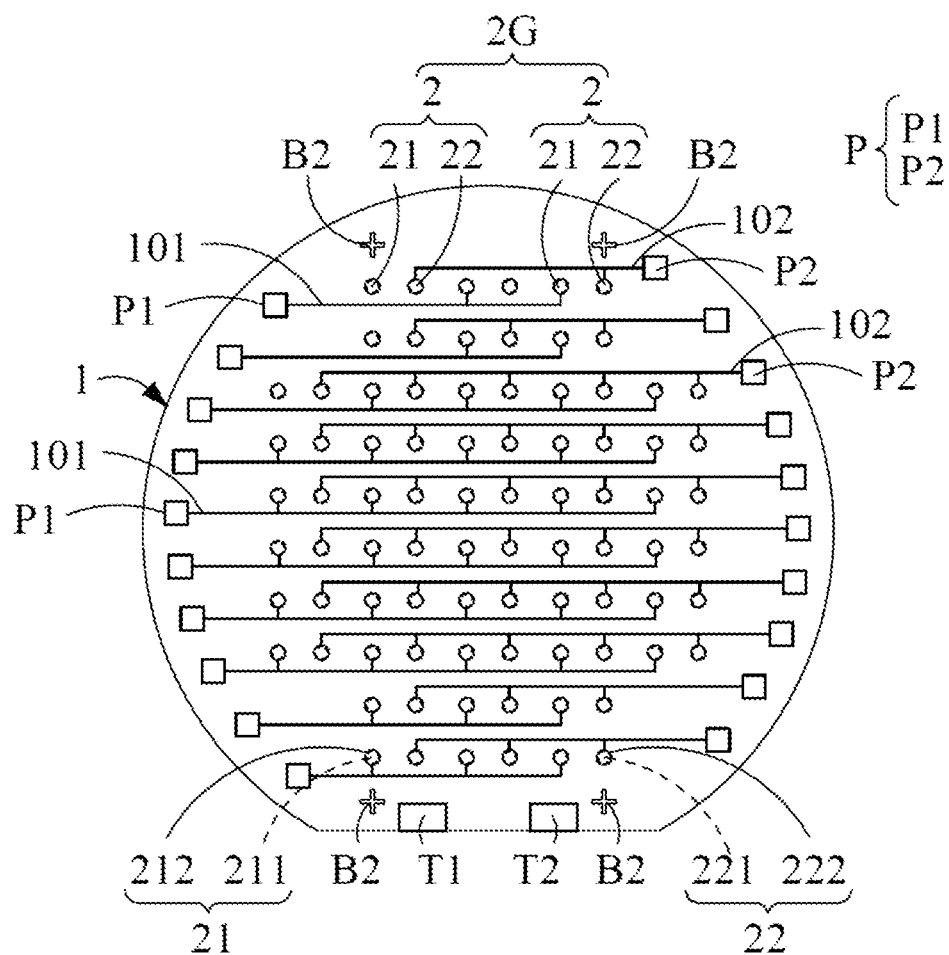
FIG. 7 is a top view of the probe substrate according to an embodiment of the present disclosure.
Figure 8:
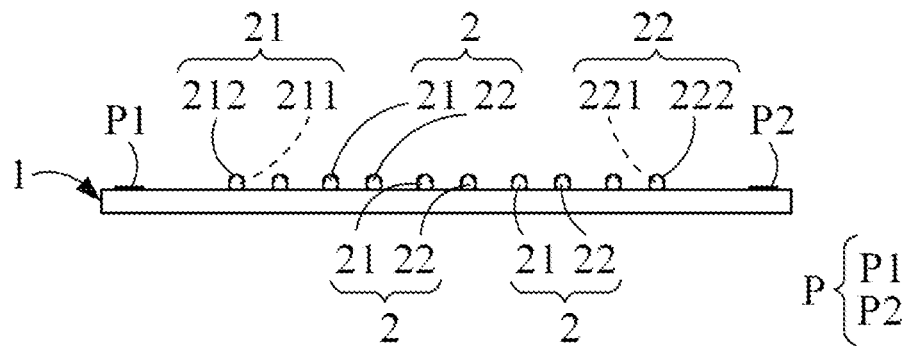
FIG. 8 is a lateral view of the probe substrate according to an embodiment of the present disclosure.

Referring to FIG. 7 and FIG. 8, the first conducting contact pin 21 includes a first cylinder 211 disposed on the probe substrate 1 and a first conducting layer 212 covering the first cylinder 211, whereas the second conducting contact pin 22 includes a second cylinder 221 disposed on the probe substrate 1 and a second conducting layer 222 covering the second cylinder 221. Furthermore, the probe substrate 1 includes multiple first conducting circuits 101 and multiple second conducting circuits 102 separated from the multiple first conducting circuits 101, respectively. Each first conducting circuit 101 is electrically connected to the first conducting layer 212 of the corresponding first conducting contact pin 21. Each second conducting circuit 102 is electrically connected to the second conducting layer 222 of the corresponding second conducting contact pin 22. However, the present disclosure is not limited thereto.

Referring to FIG. 7 and FIG. 8, the multiple probe pairs 2 are divided into multiple conducting probe groups 2G, and each conducting probe group 2G includes at least two probe pairs 2 (for example, FIG. 7 shows that the uppermost conducting probe group 2G includes three probe pairs 2). Furthermore, the probe substrate 1 includes multiple conducting electrode groups P electrically connected to the multiple conducting probe groups 2G, respectively, and each conducting electrode group P includes a first conducting electrode P1 and a second conducting electrode P2. In addition, the first conducting layer 212 of the first conducting contact pin 21 of each probe pair 2 of each conducting probe group 2G is electrically connected to (or in electrical contact with) the first conducting electrodes P1 of the corresponding conducting electrode group P through the corresponding first conducting circuit 101. The second conducting layer 222 of the second conducting contact pin 22 of each probe pair 2 of each conducting probe group 2G is electrically connected to (or in electrical contact with) the second conducting electrodes P2 of the corresponding conducting electrode group P through the corresponding second conducting circuit 102. However, the present disclosure is not limited thereto.

Figure 9:
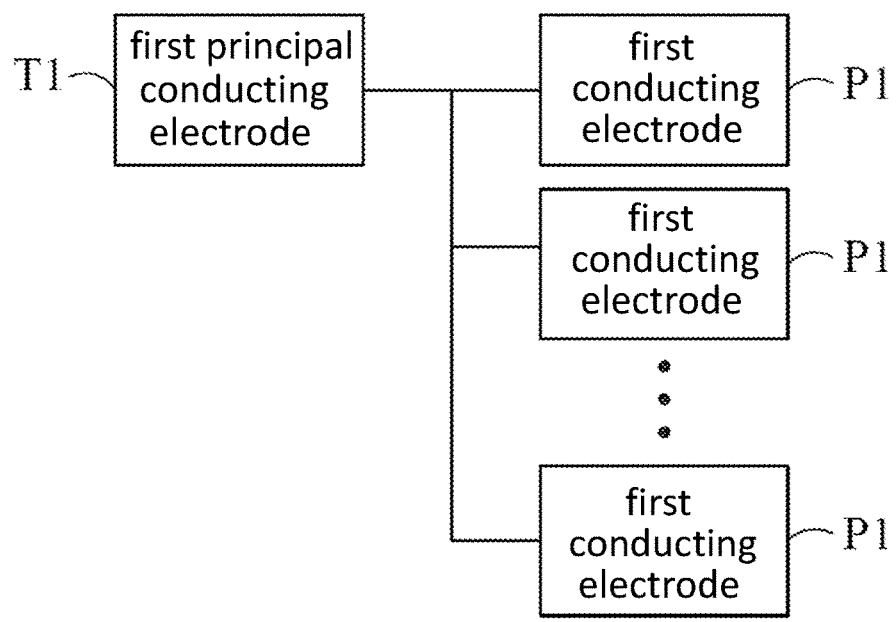
FIG. 9 is a block diagram of electrical connection between a first principal conducting electrode and multiple first conducting electrodes according to an embodiment of the present disclosure.
Figure 10:
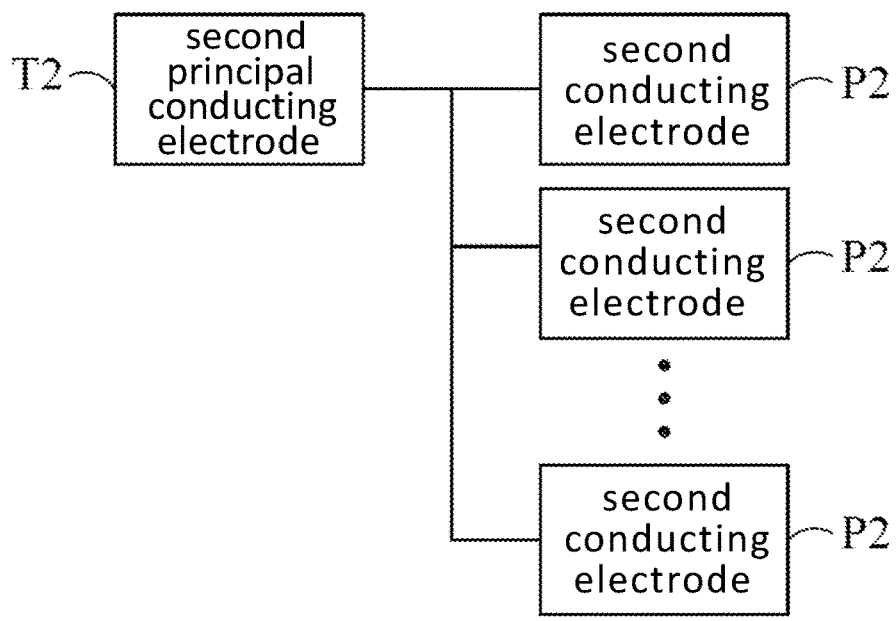
FIG. 10 is a block diagram of electrical connection between a second principal conducting electrode and multiple second conducting electrodes according to an embodiment of the present disclosure.

Referring to FIG. 7, FIG. 9 and FIG. 10, the probe substrate 1 further includes a first principal conducting electrode T1 electrically connected to multiple first conducting electrodes P1 and a second principal conducting electrode T2 electrically connected to multiple second conducting electrodes P2. Furthermore, the first principal conducting electrode T1 is electrically connected to the first conducting layer 212 of the first conducting contact pin 21 of each probe pair 2 of each conducting probe group 2G through multiple first conducting electrodes P1. Furthermore, the second principal conducting electrode T2 is electrically connected to the second conducting layer 222 of the second conducting contact pin 22 of each probe pair 2 of each conducting probe group 2G through the multiple second conducting electrodes P2. Thus, the current from the current output module C1 is provided to the corresponding probe pair 2 through the first principal conducting electrode T1 and the second principal conducting electrode T2.

Referring to FIG. 7 and FIG. 11, the testing substrate S includes multiple first alignment marks B1, whereas the probe substrate 1 includes multiple second alignment marks B2 corresponding to the multiple first alignment marks B1, respectively. Thus, given the alignment of the multiple first alignment marks B1 and the multiple second alignment marks B2, the first conducting contact pin 21 and the second conducting contact pin 22 of each probe pair 2 are precisely in electrical contact with the first conducting contact C101 and the second conducting contact C102 (shown in FIG. 13 and FIG. 14) of the corresponding under-test electronic component C, thereby lowering the chance of misalignment of the probe pairs 2 and the under-test electronic components C.

Figure 15:
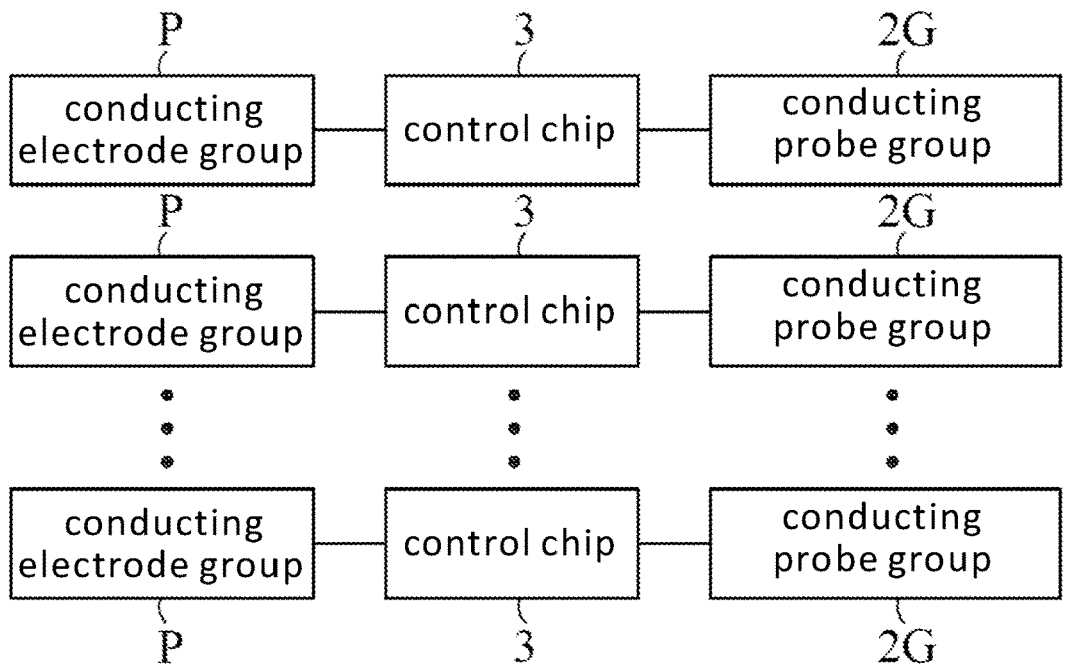
FIG. 15 is a block diagram of each control chip electrically connected between a corresponding conducting electrode group and a corresponding conducting probe group according to an embodiment of the present disclosure.

As shown in FIG. 15, when the multiple probe pairs 2 are divided into multiple conducting probe groups 2G (multiple rectangular regions), the first mounting platform M2 further includes multiple control chips 3 electrically connected to the multiple conducting probe groups 2G, respectively. The probe substrate 1 includes multiple conducting electrode groups P electrically connected to the multiple control chips 3, respectively. For instance, when the control chips 3 are each a current limiting chip, the current limiting chips control the current level, such that the multiple probe pairs 2 of each conducting probe group 2G provide a constant current to the corresponding multiple under-test electronic components C (an under-test electronic component region of one of the corresponding conducting probe groups 2G). Therefore, when the corresponding multiple under-test electronic components C generate light with the constant current provided by the multiple probe pairs 2 of the same conducting probe group 2G, optical testing is performed with the light generated by the corresponding multiple under-test electronic components C through the optical measuring component M3, such that the multiple under-test electronic components C at the same under-test electronic component region achieve categorization according to light emission quality.

The first principal conducting electrode T1, the second principal conducting electrode T2, the multiple conducting electrode groups P, the multiple first conducting circuits 101, the multiple second conducting circuits 102 and the multiple second alignment marks B2 are covered with an insulating protective layer (not shown), but the first conducting contact pin 21 and the second conducting contact pin 22 of each probe pair 2 are not covered with the insulating protective layer.

Figure 17:
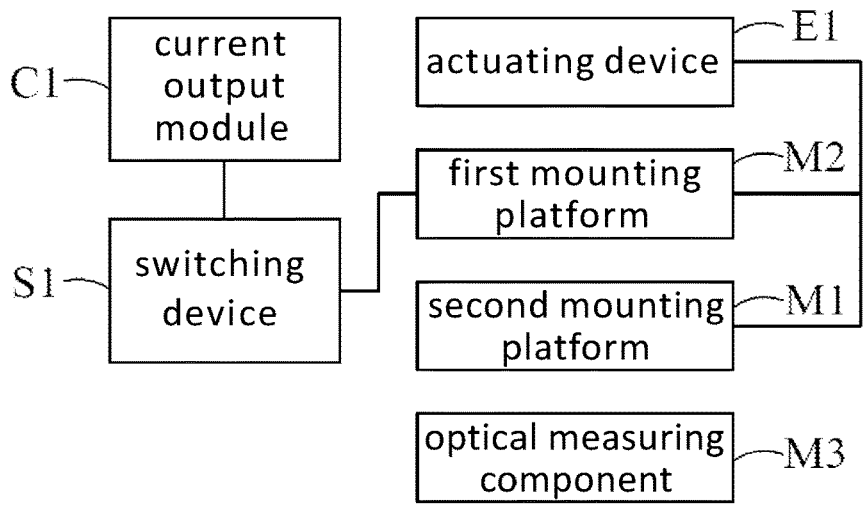
FIG. 17 is a block diagram of the electronic component measuring equipment according to an embodiment of the present disclosure.
Figure 18:
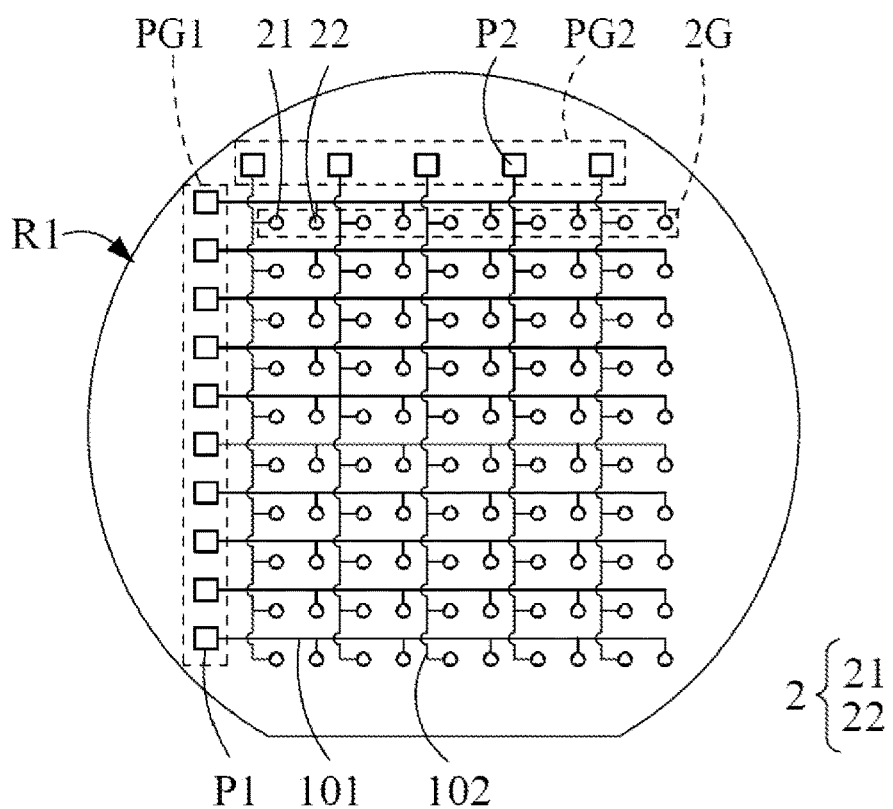
FIG. 18 is a top view of the probe substrate according to an embodiment of the present disclosure.

Referring to FIG. 17 and FIG. 18, an embodiment of the present disclosure provides another electronic component measuring equipment Z2. In this embodiment, the electronic component measuring equipment Z2 further includes a switching device S1. The switching device S1 is electrically connected to the current output module C1 and the first mounting platform M2 to switch the constant current provided by the current output module C1 to different probe pairs 2 on the first mounting platform M2.

In an embodiment, the switching device S1 is, for example, capable of switching a switch or is a multi-channel circuit switching box, but the present disclosure is not limited thereto.

In this embodiment, the multiple probe pairs 2 of the probe substrate 1 are divided into multiple conducting probe groups 2G, and each conducting probe group 2G includes at least two probe pairs 2 (for example, FIG. 18 shows that the uppermost conducting probe group 2G includes five probe pairs 2). Furthermore, the probe substrate 1 includes first conducting electrode groups PG1 and second conducting electrode groups PG2 electrically connected to multiple conducting probe groups 2G, respectively. The first conducting electrode groups PG1 include multiple first conducting electrodes P1. The second conducting electrode groups PG2 include multiple second conducting electrodes P2. The multiple first conducting electrodes P1 are not electrically connected to each other. The multiple second conducting electrodes P2 are not electrically connected to each other. The multiple probe pairs 2 in the same conducting probe group 2G are electrically connected to the same first conducting electrode P1. The multiple probe pairs 2 in the same conducting probe group 2G are electrically connected to different second conducting electrodes P2.

In this embodiment, given the control of the switching device S1, at the same point in time, at least one first conducting electrode P1 and at least one first conducting electrode P2 simultaneously provide electric power to the corresponding probe pair 2, such that the multiple probe pairs 2 of the probe substrate 1 each have one or more probe pairs 2 for receiving the electric power required to perform optical testing.

Figure 19:
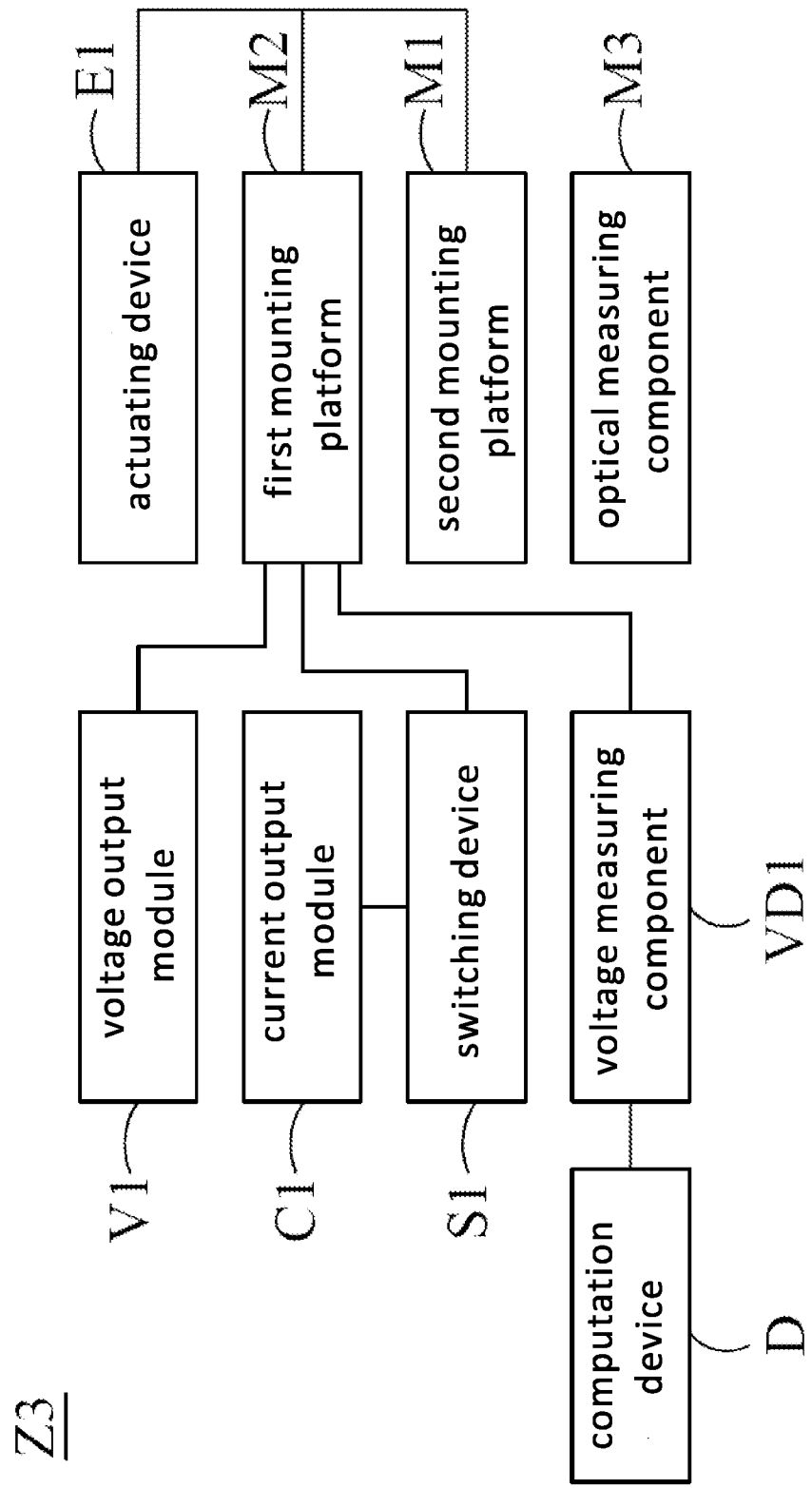
FIG. 19 is a block diagram of the electronic component measuring equipment according to an embodiment of the present disclosure.

Referring to FIG. 19, an embodiment of the present disclosure provides another electronic component measuring equipment Z3. In this embodiment, the electronic component measuring equipment Z3 further includes a voltage output module V1, a voltage measuring component VD1 and a computation device D. The voltage output module V1 is electrically connected to the first mounting platform M2 to provide a constant voltage to the first mounting platform M2. The voltage measuring component VD1 is electrically connected to the first mounting platform M2 to measure the voltage generated by the under-test electronic components C on the testing substrate S mounted on the second mounting platform M1. The computation device D receives the voltage measured by the voltage measuring component VD1 to calculate the driving voltage of the under-test electronic components C.

Referring to FIG. 18 and FIG. 19, in this embodiment, at the same time, only one first conducting electrode P1 and only one second conducting electrode P2 can provide electric power to the corresponding under-test electronic component C to create a conducting loop.

As shown in FIG. 14, the actuating device E1 enables the first mounting platform M2 and the second mounting platform M1 to approach each other and come into contact with each other, whereas the first conducting contact pin 21 and second the conducting contact pin 22 of each probe pair 2 are in electrical contact with the first conducting contact C101 and the second conducting contact C102 of the corresponding under-test electronic component C, respectively, such that the multiple under-test electronic components C and the corresponding probe pair 2 together create an under-test loop, whereas one of the probe pairs 2 transmits the provided electric power to the corresponding under-test electronic component C. Thus, the under-test loop becomes a conducting loop, and the under-test electronic components C generate light L. Furthermore, optical testing is performed with the light L generated by the under-test electronic components C through the optical measuring component M3. The voltage measuring component VD1 (shown in FIG. 19) measures the driving voltage generated by the conducting loop and provides the driving voltage to the computation device D.

In an embodiment, the voltage measuring component VD1 measures the cross voltage between the first conducting electrodes P1 and the second conducting electrodes P2 which form the conducting loop together with the under-test electronic components C, so as to obtain the driving voltage. For instance, the voltage measuring component VD1 measures the voltage level of the first conducting electrodes P1 or the second conducting electrodes P2 for receiving the constant current to obtain the driving voltage.

In an embodiment, the under-test electronic components C are, for example, resistive components with known resistance values.

In an embodiment, the resistance values of the resistive components with known resistance values are greater than $0\Omega$ and less than or equal to $100\Omega$. For example, the resistance values of the resistive components with known resistance values range from $0.0001\Omega$ to $100\Omega$, but the present disclosure is not limited thereto.

Therefore, in the embodiment where the under-test electronic components C are resistive components with known resistance values, one of the multiple resistive components and the corresponding probe pair 2 together create a first conducting loop. The voltage measuring component VD1 measures the first driving voltage generated by the first conducting loop and provides the first driving voltage to the computation device D. Thus, the computation device D obtains the first driving voltage generated by each resistive component.

In an embodiment, the under-test electronic components C are, for example, LEDs.

Therefore, in the embodiment where the under-test electronic components C are LEDs, one of the multiple LEDs and the corresponding probe pair 2 together form a second conducting loop. The first conducting loop and the second conducting loop correspond to each other; thus, the first conducting loop and the second conducting loop are conducting loops formed from the same probe pair 2. One of the multiple LEDs generates light L with the electric power provided by the corresponding probe pair 2. Optical testing is performed with light L generated by the LEDs through the optical measuring component M3. The voltage measuring component VD1 measures the second driving voltage generated by the second conducting loop and provides the second driving voltage to the computation device D. Thus, the computation device D obtains the second driving voltage generated by each LED.

The first driving voltage and the second driving voltage are measured by the circuit formed from the same probe pair 2. The first driving voltage is generated by resistive components with known resistance values. Thus, the driving voltage of the LEDs is obtained according to the voltage difference between the first driving voltage and the second driving voltage. Therefore, in the embodiment, the computation device D calculates the voltage difference between the corresponding first driving voltage and the second driving voltage to obtain the driving voltage of the LEDs. The first driving voltage and the second driving voltage are measured by the circuit formed from the same probe pair 2. Thus, the electrical property state (routing resistance value and process variation) on the circuit does not affect the result of the measurement of the driving voltage of the LEDs, thereby improving the correctness of the measurement of the driving voltage of the LEDs.

In an embodiment, the computation device D is, for example, a computer server, but the present disclosure is not limited thereto.

Figure 20:
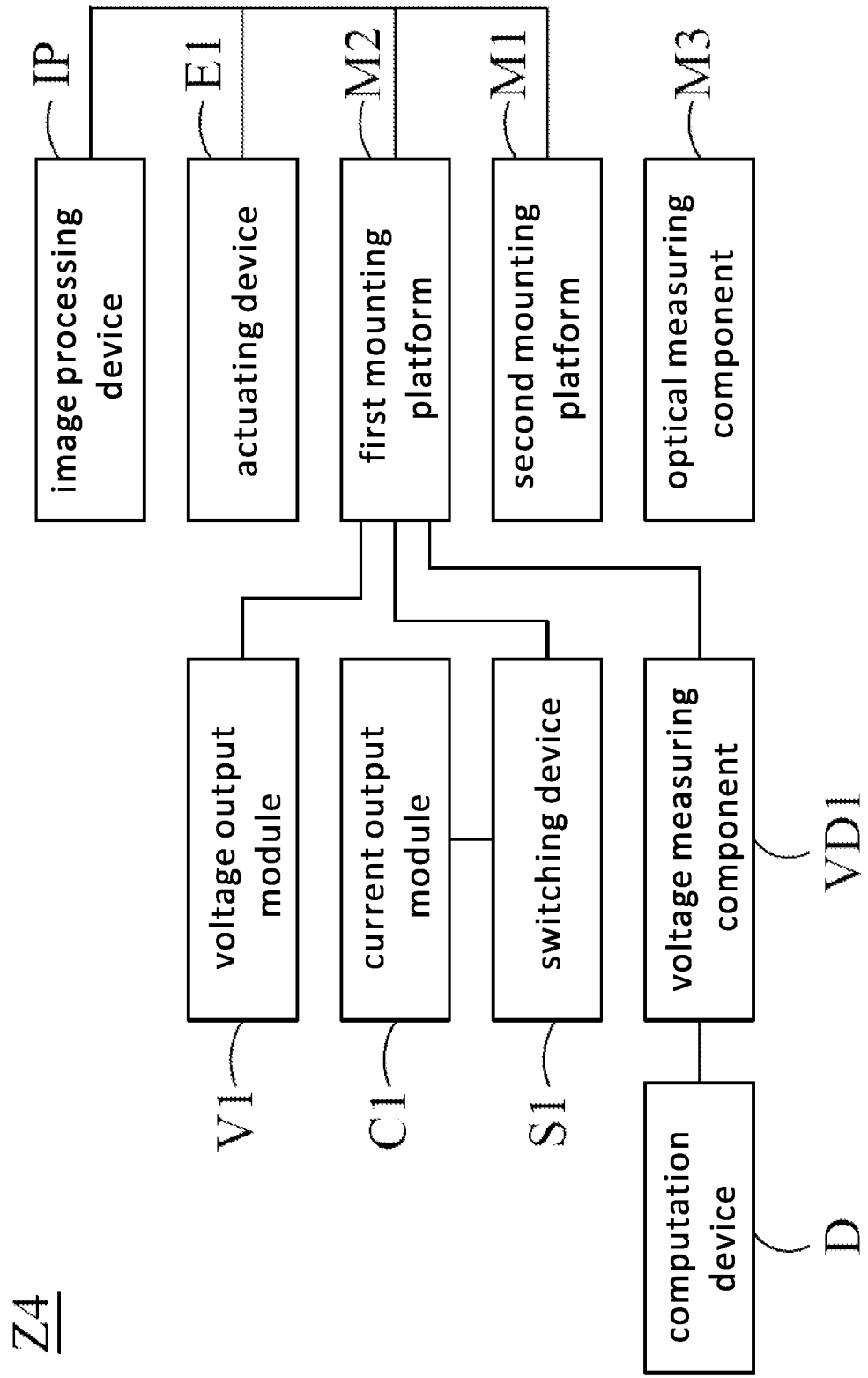
FIG. 20 is a block diagram of the electronic component measuring equipment according to an embodiment of the present disclosure.

Referring to FIG. 20, an embodiment of the present disclosure provides another electronic component measuring equipment Z4. In this embodiment, electronic component measuring equipment Z4 further includes an image processing device IP disposed at the first mounting platform M2 and adapted to obtain an image including first alignment marks B1 and second alignment marks B2 (shown in FIG. 7 and FIG. 11). Image comparison is carried out to control the alignment between the first mounting platform M2 and the second mounting platform M1 to ensure precise alignment between the probe pairs 2 of the probe substrate 1 mounted on the first mounting platform M2 and the under-test electronic components C of the testing substrate S mounted on the second mounting platform M1 (shown in FIG. 13).

In an embodiment, the image processing device IP is, for example, an optical image alignment system, but the present disclosure is not limited thereto.

Figure 21:
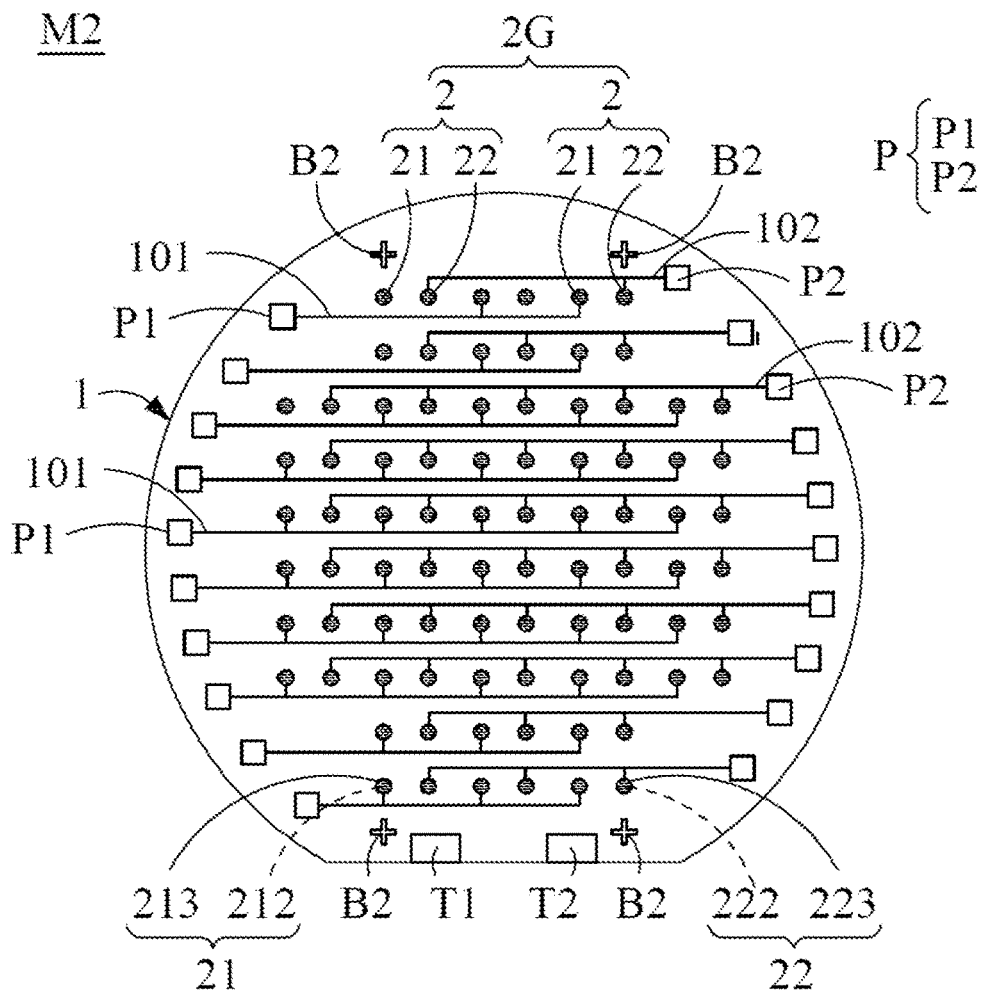
FIG. 21 is a top view of the probe substrate according to another embodiment of the present disclosure.
Figure 22:
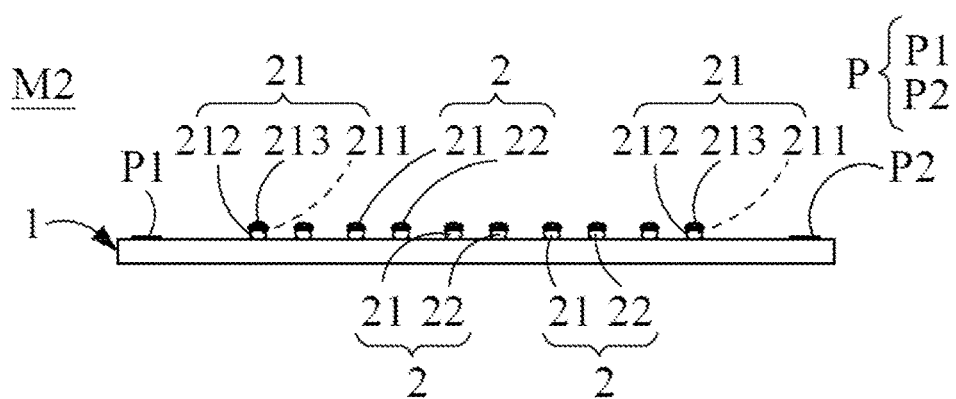
FIG. 22 is a lateral view of the probe substrate according to another embodiment of the present disclosure.

Referring to FIG. 8. FIG. 21 and FIG. 22, after the step of patterning the second material layer R2 to form the probe substrate 1 shown in FIG. 8, the method of manufacturing the probe substrate 1 further includes: forming a conducting material (for example, nano silver, silver paste, and conductive UV paste) capable of buffering resiliently on the multiple first conducting layer 212 and the multiple second conducting layer 222 by printing, coating, evaporation deposition, sputtering, or impregnation. For instance, the conducting material covers a top end of the first conducting layer 212 to form a first resilient contact layer 213 capable of buffering resiliently (with the conducting material covering a top end of the second conducting layer 222) and form a second resilient contact layer 223 capable of buffering resiliently. Thus, as shown in FIG. 23, the first conducting contact pin 21 and the second conducting contact pin 22 of each probe pair 2 are in electrical contact with the first conducting contact C101 and the second conducting contact C102 of the corresponding under-test electronic component C, whereas the first resilient contact layer 213 of the first conducting contact pin 21 and the second resilient contact layer 223 of the second conducting contact pin 22 are in direct contact with the first conducting contact C101 and the second conducting contact C102 of the corresponding under-test electronic component C, respectively; thus, not only is the abrasive effect or the impact of the first conducting contact pin 21 on the first conducting contact C101 reduced by the first resilient contact layer 213, but the abrasive effect or the impact of the second conducting contact pin 22 on the second conducting contact C102 is also reduced by the second resilient contact layer 223, so as to effectively extend the service life of the multiple probe pairs 2.

Figure 23:
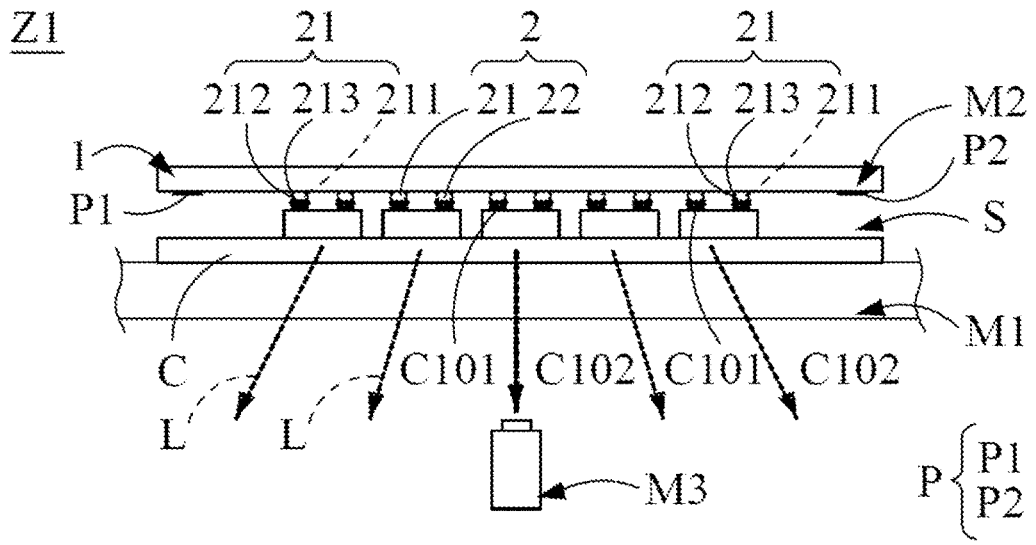
FIG. 23 is a lateral view of the probe substrate of the electronic component measuring equipment according to another embodiment of the present disclosure after electrically contacting with the testing substrate.

Referring to FIG. 22 and FIG. 23, the first conducting contact pin 21 includes a first resilient contact layer 213 which covers the first conducting layer 212 in whole or in part and thereby is in electrical contact with the first conducting contact C101 of the corresponding under-test electronic component C. Furthermore, the second conducting contact pin 22 includes a second resilient contact layer 223 which covers the second conducting layer 222 in whole or in part and thereby is in electrical contact with the second conducting contact C102 of the corresponding under-test electronic component C.

Referring to FIG. 21 and FIG. 22, the first resilient contact layer 213 of the first conducting contact pin 21 of each probe pair 2 of each conducting probe group 2G is electrically connected to the first conducting electrodes P1 of the corresponding conducting electrode group P by the corresponding first conducting circuit 101. Furthermore, the second resilient contact layer 223 of the second conducting contact pin 22 of each probe pair 2 of each conducting probe group 2G is electrically connected to the second conducting electrodes P2 of the corresponding conducting electrode group P by the corresponding second conducting circuit 102.

Referring to FIG. 21 and FIG. 22, the first principal conducting electrode T1 is electrically connected to the first resilient contact layer 213 of the first conducting contact pin 21 of each probe pair 2 of each conducting probe group 2G by the multiple first conducting electrodes P1. Furthermore, the second principal conducting electrode T2 is electrically connected to the second resilient contact layer 223 of the second conducting contact pin 22 of each probe pair 2 of each conducting probe group 2G by the multiple second conducting electrodes P2. Since the first principal conducting electrode T1 is simultaneously electrically connected to the multiple first conducting electrodes P1, the first mounting platform M2 provides electric power simultaneously to all the multiple first conducting contact pins 21 through the first principal conducting electrode T1. Furthermore, with the second principal conducting electrode T2 being simultaneously electrically connected to the multiple second conducting electrodes P2, the first mounting platform M2 provides electric power simultaneously to all the multiple second conducting contact pins 22 through the second principal conducting electrode T2.

Figure 24:
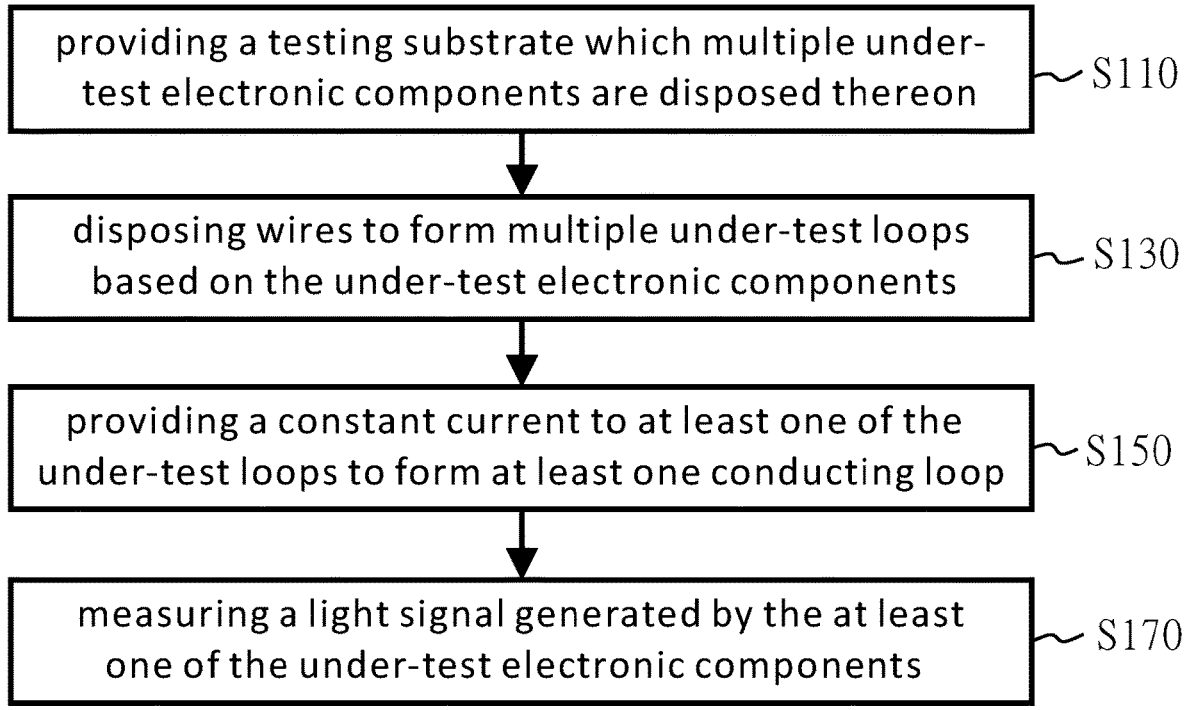
FIG. 24 is a schematic view of the process flow of an electronic component measuring method according to an embodiment of the present disclosure.

The present disclosure further provides an electronic component measuring method based on the aforesaid preferred embodiments and applications and implemented by the electronic component measuring equipment (Z1~Z4). As shown in FIG. 24, the method includes the steps of:

providing a testing substrate which multiple under-test electronic components are disposed thereon (S110);

disposing wires to form multiple under-test loops based on the under-test electronic components (S130), wherein each of the wires is, for example, to form an under-test loop among the probe pairs 2, first conducting electrodes P1 and second conducting electrodes P2;

providing a constant current to at least one of the under-test loops to form at least one conducting loop (S150); and measuring a light signal generated by the at least one of the under-test electronic components (S170).

Figure 25:
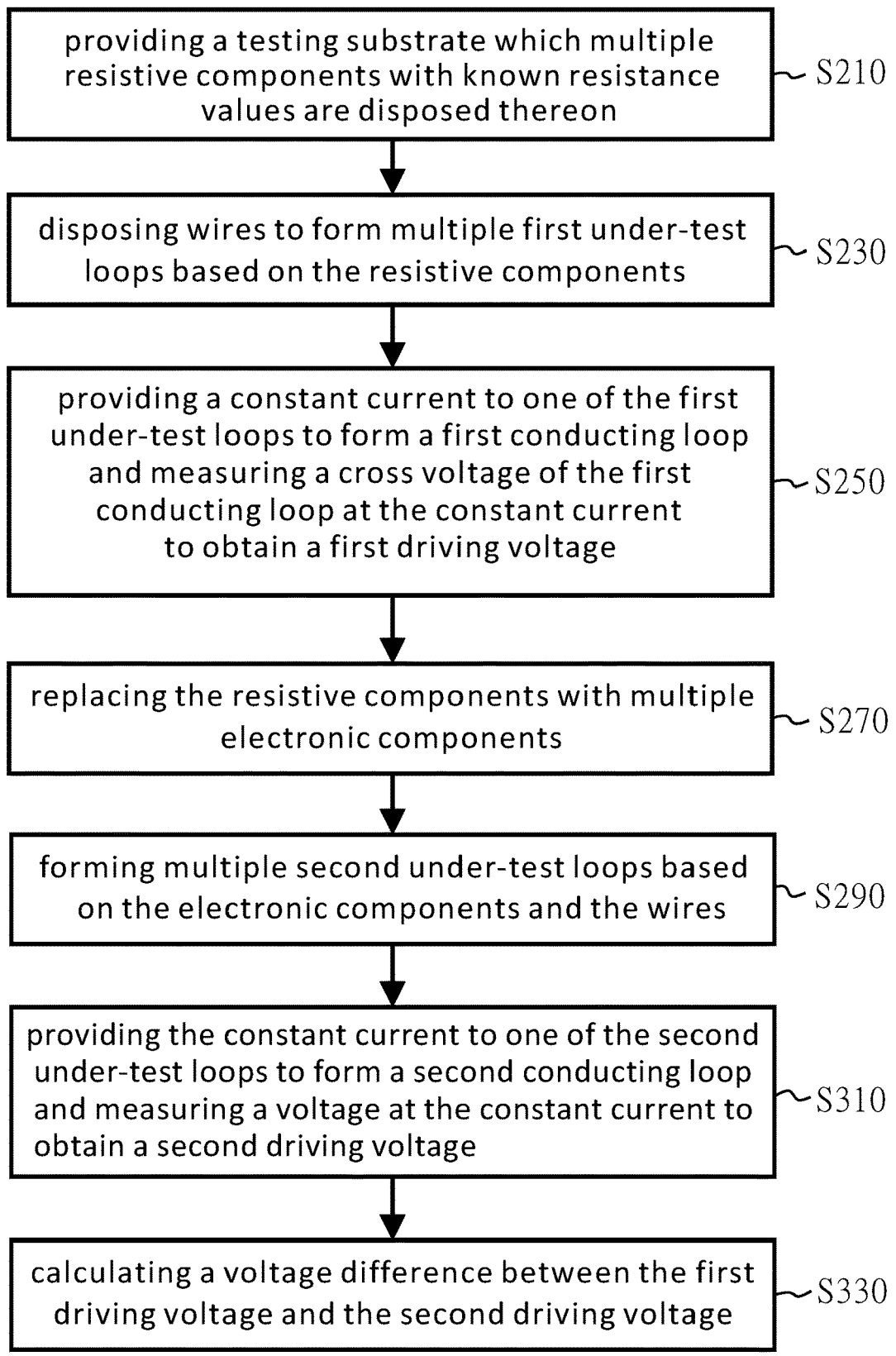
FIG. 25 is a schematic view of the process flow of the electronic component measuring method according to another embodiment of the present disclosure.

The present disclosure provides another electronic component measuring method based on the aforesaid preferred embodiments and applications and implemented by the electronic component measuring equipment (Z2~Z4). As shown in FIG. 25, the method includes the steps of:

providing a testing substrate which multiple resistive components with known resistance values are disposed thereon (S210);

disposing wires to form multiple first under-test loops based on the resistive components (S230);

providing a constant current to one of the first under-test loops to form a first conducting loop and measuring a cross voltage of the first conducting loop at the constant current to obtain a first driving voltage (S250);

replacing the resistive components with multiple electronic components (S270);

forming multiple second under-test loops based on the electronic components and the wires (S290);

providing the constant current to one of the second under-test loops to form a second conducting loop and measuring a voltage at the constant current to obtain a second driving voltage (S310); and calculating a voltage difference between the first driving voltage and the second driving voltage (S330).

In an embodiment, the electronic components are LEDs, and the LED manufacturing method is characterized by an electronic component measuring equipment for use in the electronic component measuring method, a testing substrate mounted on a second mounting platform and including multiple under-test electronic components, a first mounting platform disposed above the second mounting platform and including a probe substrate and multiple probe pairs on the probe substrate, and an optical measuring component disposed below the second mounting platform to perform optical testing on multiple under-test electronic components, allowing the under-test electronic components to emit light with electric power passing the corresponding probe pair. Furthermore, an optical measuring component performs optical testing on the under-test electronic components with the light generated by the under-test electronic components efficiently.

The present disclosure provides an electronic component measuring equipment characterized by multiple probe pairs disposed on a probe substrate and each including a first conducting contact pin and a second conducting contact pin, so as for a first conducting contact pin and a second conducting contact pin of each probe pair to be in electrical contact with a first conducting contact and a second conducting contact of the corresponding under-test electronic component, respectively, thereby allowing an optical measuring component performs optical testing on the under-test electronic components with the light generated by the under-test electronic components efficiently.

According to the present disclosure, the optical testing is performed with an optical measuring component to enhance the efficiency of performing the optical testing on the under-test electronic components.

The present disclosure provides an electronic component measuring equipment capable of measuring the cross voltage of the conducting loop formed by one circuit and different electronic components, quickly calculating the driving voltage of the under-test electronic components which form a conducting loop together with a circuit, and thereby enhancing the efficiency of the electrical testing of the under-test electronic components.

While the present disclosure has been described by means of specific embodiments, numerous modifications and variations could be made thereto by those skilled in the art without departing from the scope and spirit of the present disclosure set forth in the claims.

What is claimed is:

1. An electronic component measuring equipment, comprising:

a first mounting platform for mounting a probe substrate, the probe substrate having multiple probe pairs disposed thereon;

a second mounting platform for mounting a testing substrate, the testing substrate having multiple under-test electronic components disposed thereon;

an actuating device configured to make the first mounting platform and the second mounting platform approach each other, such that at least partial of the probe pairs on the probe substrate mounted on the first mounting platform are in contact with at least partial of the under-test electronic components on the testing substrate mounted on the corresponding second mounting platform, respectively;

a current output module for providing a constant current to the probe substrate mounted on the first mounting platform, whereby conducting loops are formed between the at least partial of probe pairs and the at least partial of under-test electronic component in contact with the at least partial of probe pairs, allowing the at least partial of under-test electronic components to generate light signals through the conducting loops;
a switching device for switching the constant current provided by the current output module to each of the at least partial of probe pairs; and
an optical measuring component for measuring the light signals generated by the at least partial of under-test electronic components on the testing substrate mounted on the second mounting platform.

2. The electronic component measuring equipment of claim 1, wherein the current output module outputs the constant current to one of the at least partial of probe pairs on the probe substrate mounted on the first mounting platform, and then the switching device switches the constant current output to another of the at least partial of probe pairs.

3. The electronic component measuring equipment of claim 1, wherein the current output module outputs the constant current to a group of the at least partial of probe pairs on the probe substrate mounted on the first mounting platform, and then the switching device switches the constant current output to another group of the at least partial of probe pairs.

4. The electronic component measuring equipment of claim 1, further comprising an image processing device for aligning the at least partial of probe pairs on the probe substrate mounted on the first mounting platform with the at least partial of under-test electronic components on the testing substrate mounted on the second mounting platform.

5. An electronic component measuring equipment, comprising:
a first mounting platform for mounting a probe substrate, the probe substrate having multiple probe pairs disposed thereon;
a second mounting platform for mounting a testing substrate, the testing substrate having multiple under-test electronic components disposed thereon;
an actuating device configured to make the first mounting platform and the second mounting platform approach each other, such that at least partial of the probe pairs on the probe substrate mounted on the first mounting platform are in contact with at least partial of the under-test electronic components on the testing substrate mounted on the corresponding second mounting platform, respectively;
a current output module for providing a constant current to the probe substrate mounted on the first mounting platform, whereby conducting loops are formed between the at least partial of probe pairs and the at least partial of under-test electronic components in contact with the at least partial of probe pairs;
a switching device for switching the constant current provided by the current output module to each of the at least partial of probe pairs;
a voltage measuring component for measuring voltages of the at least partial of under-test electronic components on the testing substrate mounted on the second mounting platform; and
a computation device electrically connected to the voltage measuring component to receive the voltages measured by the voltage measuring component.

6. The electronic component measuring equipment of claim 5, wherein the current output module outputs the constant current to one of the at least partial of probe pairs on the probe substrate mounted on the first mounting platform, and then the switching device switches the constant current output to another of the at least partial of probe pairs.

7. The electronic component measuring equipment of claim 5, further comprising an image processing device for aligning the at least partial of probe pairs on the probe substrate mounted on the first mounting platform with the at least partial of under-test electronic components on the testing substrate mounted on the second mounting platform.

8. An electronic component measuring method, comprising the steps of:
providing a testing substrate, the testing substrate having multiple under-test electronic components disposed thereon;
disposing wires to form multiple under-test loops based on the under-test electronic components;
providing a constant current to at least one of the under-test loops to form at least one conducting loop; and
measuring a light signal generated by the at least one of the under-test electronic components.

9. The electronic component measuring method of claim 8, wherein the light signal is a wavelength of light.

10. An LED manufacturing method, comprising the electronic component measuring method of claim 9.

11. The electronic component measuring method of claim 8, wherein the light signal is brightness of light.

12. An LED manufacturing method, comprising the electronic component measuring method of claim 11.

13. The electronic component measuring method of claim 8, wherein the constant current ranges from 20 µA to 20 mA.

14. An LED manufacturing method, comprising the electronic component measuring method of claim 13.

15. An LED manufacturing method, comprising the electronic component measuring method of claim 8.

16. An electronic component measuring method, comprising the steps of:
providing a testing substrate, the testing substrate having thereon multiple resistive components with known resistance values;
disposing wires to form multiple first under-test loops based on the resistive components;
providing a constant current to one of the first under-test loops to form a first conducting loop and measuring a cross voltage of the first conducting loop at the constant current to obtain a first driving voltage;
replacing the resistive components with multiple electronic components;
forming multiple second under-test loops based on the electronic components and the wires;
providing the constant current to one of the second under-test loops to form a second conducting loop and measuring a voltage at the constant current to obtain a second driving voltage; and
calculating a voltage difference between the first driving voltage and the second driving voltage.

17. The electronic component measuring method of claim 16, wherein the known resistance values are greater than 0Ω and less than or equal to 100Ω.

18. An LED manufacturing method, comprising the electronic component measuring method of claim 17.

19. The electronic component measuring method of claim 16, wherein the constant current ranges from 20 µA to 20 mA.

20. An LED manufacturing method, comprising the electronic component measuring method of claim 19.

21. An LED manufacturing method, comprising the electronic component measuring method of claim 16.

* * * * *